United States Patent [19]

Carder

[11] Patent Number: 5,637,994
[45] Date of Patent: Jun. 10, 1997

[54] WAVEFORM MEASUREMENT

[75] Inventor: Norman G. Carder, South Queensferry, Scotland

[73] Assignee: Hewlett-Packard Company, Palo Alto, Calif.

[21] Appl. No.: 13,252

[22] Filed: Feb. 3, 1993

Related U.S. Application Data

[63] Continuation of Ser. No. 698,840, May 10, 1991, abandoned.

[30] Foreign Application Priority Data

Aug. 14, 1990 [EP] European Pat. Off. ............ 90308932

[51] Int. Cl.[6] .................................................. G01R 17/00
[52] U.S. Cl. ......................... 324/76.13; 324/76.16; 364/554; 364/487
[58] Field of Search ..................... 324/76.13, 76.16, 324/605; 371/20.4; 364/487, 554

[56] References Cited

U.S. PATENT DOCUMENTS

| | | | |
|---|---|---|---|
| 3,290,592 | 12/1966 | Pharo | 324/77 A |
| 3,359,491 | 12/1967 | McCutcheon | 324/122 R |
| 3,360,723 | 12/1967 | Royce | 324/77 A |
| 3,416,080 | 12/1968 | Wright | 324/76.16 |
| 3,543,156 | 11/1970 | Hall et al. | |
| 3,544,774 | 12/1970 | Peklenik | 364/554 |
| 3,571,705 | 3/1971 | Crane | 324/76.16 |
| 3,742,352 | 6/1973 | Euer | 324/77 A |
| 4,041,386 | 8/1977 | Thomas | 324/76.16 |
| 4,084,245 | 4/1978 | Bunge | 364/554 |
| 4,204,260 | 5/1980 | Nysen | 364/554 |
| 4,581,585 | 4/1986 | Bristol | 324/121 R |
| 4,774,681 | 9/1988 | Frisch | 364/554 |
| 4,779,044 | 10/1988 | Skolnick et al. | |
| 4,985,844 | 1/1991 | Foley | 364/554 |
| 5,043,927 | 8/1991 | Jackson | 324/77 A |

FOREIGN PATENT DOCUMENTS

| | | | |
|---|---|---|---|
| 2 401 425 | 3/1979 | France . | |
| 1448771 | 9/1969 | Germany | 324/77 A |

OTHER PUBLICATIONS

A.A. Guido, et al., "Automatic Pulse Parameter Determination with the Computer Augmented Oscilloscope System", I.B.M. Journal of Research and Development, vol. 15, No. 3, May 1971, pp. 204–212.

P.E. Stuckert, "The IEEE/IEC Pulse Standards—Basic Tools for Waveform Analysis", IEEE Transactions on Instrumentation and Measurment vol. IM-31, No. 3, Sep. 1982, pp. 192–198.

Extract on Analog Devices' AD9500 Device, Analog Devices Linear Products Databook, Apr. 1988, pp. 9–49.

*Primary Examiner*—Kenneth A. Wieder
*Assistant Examiner*—Jose M. Solis

[57] ABSTRACT

The characteristics of an a.c. waveform are determined by measuring the time interval between the instant when the waveform crosses a first reference threshold and the instant when it crosses another threshold. The second threshold is varied to obtain a series of time interval measurements from which a point by point reconstruction of the waveform can be made. The technique has the advantage that it can be used to characterize waveforms whose arrival time is indeterminable.

8 Claims, 2 Drawing Sheets

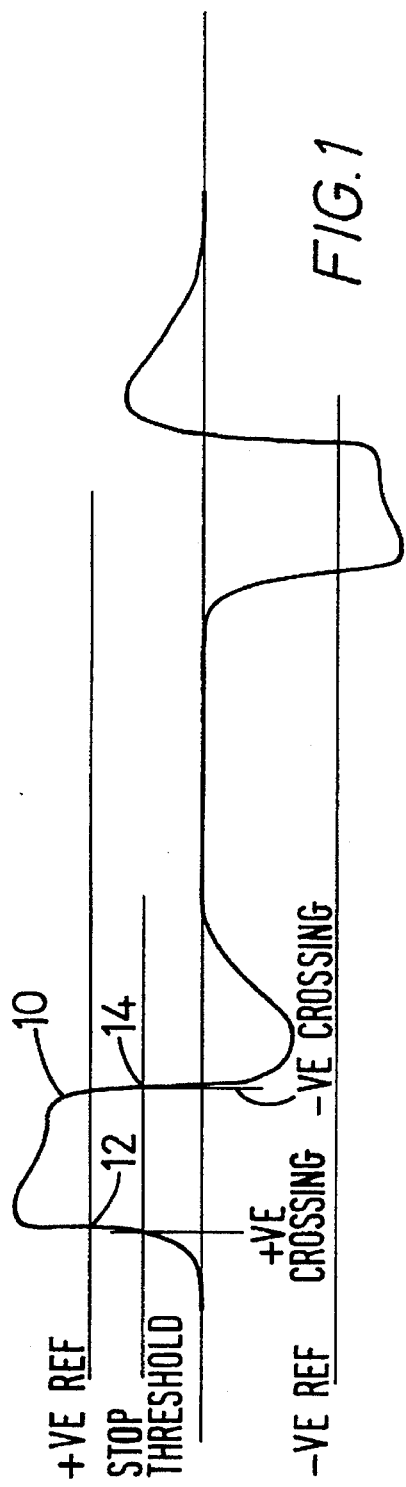
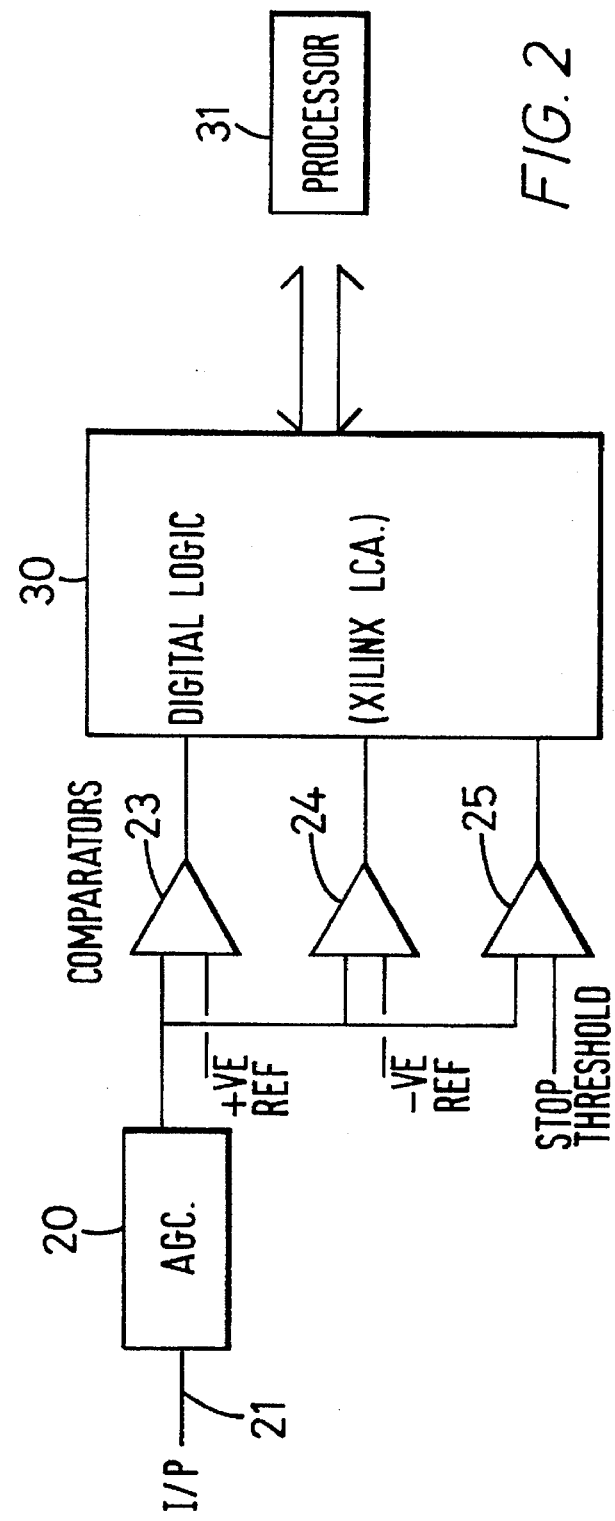

WAVEFORM MEASUREMENT

This is a continuation of application Ser. No. 698,840, filed May 10, 1991, now abandoned.

BACKGROUND OF THE INVENTION

This invention relates to the measurement of characteristics of a.c. waveforms.

In the field of electronic circuitry there is often a requirement for the shape of a pulse waveform to be measured so that it can be analyzed to assess whether it meets certain criteria. The measured pulse waveform can be compared with a standard mask to see whether it meets a prescribed specification. This comparison may include the measurement of the pulse width, the rise time, the fall time and any overshoot or undershoot.

A known technique for measuring the shape of a high speed a.c. waveform makes use of two circuits each with a programmable delay. One such circuit is used to trigger a device under test to produce an output pulse which is fed to a comparator. The other circuit is used to enable the comparator and its delay setting is adjusted to the point where the level of output of the device under test equals a threshold signal applied to the comparator from a digital-to-analogue converter. By varying the threshold level and adjusting the delay of the second circuit it is possible to produce a point-by-point reconstruction of the a.c. waveform output from the device under test. The circuit operates in response to clock pulses applied to the two circuits with the programmable delay.

SUMMARY OF THE INVENTION

The present invention is concerned with a technique for measuring waveforms which can arrive at any time and is not restricted to measuring waveforms generated in response to signals produced at predetermined instants.

According to one aspect of the present invention there is provided a method of measuring the characteristics of an ac waveform comprising measuring the time interval between the instant when the waveform level attains a reference level and an instant when the waveform level attains some other level, repeating the measurements for a plurality of said other levels, and reconstructing the waveform from said measured values.

The method may include the step of obtaining several samples of each measurement and evaluating an average. The time may be measured by starting a counter at the instant the reference level is attained and stopping said counter when the other level is attained.

The signal for initiating the stopping of said counter may be delayed to allow measurement of the waveform shape prior to the reference level.

According to another aspect of the present invention there is provided apparatus for use in measuring the characteristics of a waveform which comprises means for sensing when a waveform attains a predetermined first level and for sensing when said waveform attains a variable second level, and means for measuring the time interval between the instant when the waveform attains said predetermined first level and the instant when the waveform attains said second level. The measuring means may comprise a counter. The sensing means may comprise one or more comparators.

BRIEF DESCRIPTION OF THE DRAWINGS

The invention will be described now by way of example only with particular reference to the accompanying drawings wherein:

FIG. 1 is a waveform diagram illustrating the principles of the present invention, FIG. 2 is a block schematic diagram of circuitry for use in carrying out the method.

DESCRIPTION OF A PREFERRED EMBODIMENT

Figure 3:
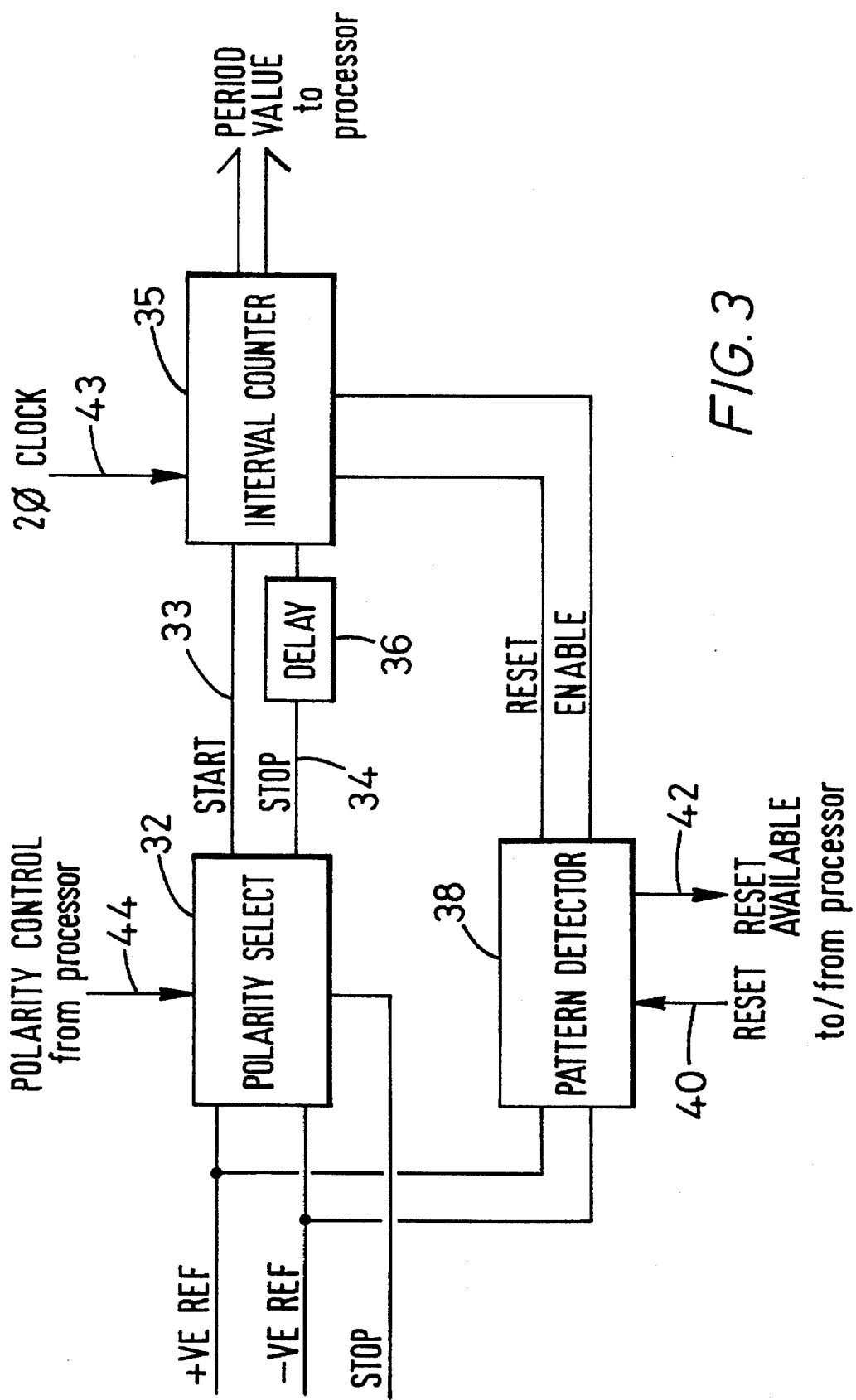
FIG. 3 is a block circuit diagram showing in more detail part of the circuit of FIG. 2.

The present technique for measuring the characteristics of a pulse waveform will first be described with reference to FIG. 1. The method involves sensing when the pulse waveform 10 attains a reference threshold level 12 and the instant when the waveform reaches some other threshold (the stop threshold) shown at 14 and measuring the time interval between the two thresholds. The time interval can be measured by triggering a counter to start counting when the waveform reaches the first threshold level that is the reference threshold level and stopping the counter when the waveform reaches the stop threshold. By carrying out measurements for a plurality of different stop thresholds it is possible to build-up a point-by-point picture of the waveform being measured.

The reference threshold level can be any suitable level and typically will correspond to 75% of the expected peak level of the waveform. This applies whether the pulse is a positive going pulse or a negative going pulse since the method can be used to measure pulses of either polarity.

To allow measurement of that part of the waveform which occurs prior to the reference position, the signal for triggering the stopping of the counter can be delayed by a predetermined delay.

At certain voltage levels there may be more than one crossing of the variable threshold level, (i.e. the stop threshold). This can occur for example at the top of the pulse or around the zero point. To use this extra information two stop positions are measured simultaneously by the measurement hardware.

An important feature of the present technique is that it can be used to measure the shape of waveforms whose arrival time is not predictable.

A circuit for carrying out the measurement technique is illustrated in FIG. 2 of the drawings. This comprises an automatic gain control circuit 20 which receives waveforms to be measured on its input 21. The output from the automatic gain control circuit is fed to three comparators 23 to 25. Two of these comparators, comparators 23 and 24, have fixed threshold levels i.e. the reference threshold referred to above. One comparator, comparator 23, is arranged to trigger on positive going pulses and the other comparator, comparator 24, is arranged to trigger on negative going pulses. The threshold level of the third comparator 25 can be varied and this determines the stop threshold referred to above. The method involves measuring the time period from when the signal crosses one of the thresholds determined by the comparators 23 or 24 and the instant when the signal crosses the stop threshold set by the comparator 25.

The outputs of the comparators are connected to a digital logic block shown at 30 which in turn is connected to a suitable processor 31. The block 30 is shown in more detail in FIG. 3. As shown in FIG. 3, this circuit comprises a polarity select circuit 32 which receives the outputs from the comparators 23 to 25. The polarity select circuit has two outputs, a first 33 of which carries a start signal for triggering a counter 35. The second output 34 from the polarity select circuit carries a stop signal which is fed via a delay circuit 36 to the counter 35.

The circuit of FIG. 3 also includes a pattern detector 38 which receives the outputs from the comparators 23 and 24 and can provide reset and enable signals to the counter 35. The pattern detector 38 can receive a reset signal on line 40 from the processor and can provide data to the processor on line 42. The counter 35 has an input 43 from a two-phase clock and the polarity select circuit can receive polarity control signals from the processor on an input 44.

In operation, when one of the comparators 23 or 24 is triggered by an incoming waveform, the polarity select circuit provides a start signal which sets the counter 35 counting. The counter continues counting until the waveform crosses the threshold set by the comparator 25 in response to which the polarity select circuit 32 provides a stop signal which is fed via the delay circuit 36 to stop the counter 35 counting. The count of the counter 35 is fed to the processor 31 for processing. This is repeated for a plurality of stop thresholds. The stop threshold can be adjusted under processor control.

The use of the two comparators 23 and 24 allows both positive and negative pulses to be measured. Changing the polarity of the output from comparator 25 allows both rising and falling edges to be measured. The delay circuit 36 between the select circuit 32 and the counter 35 makes it possible to measure the response of the waveform prior to the point when the reference threshold is crossed. The circuit of FIG. 3 can be implemented in a Xilinx Logic Cell Array which is clocked by a two phase 17.5 MHz clock.

The measured time intervals are transformed into a waveform shape by the processors and then pulse parameters can be measured by that processor. It should be understood that a number of different methods may be employed to measure characteristics of the waveform. One technique for reproducing the waveform from the measured time intervals would be to plot the reference levels as a function of the measured time intervals and connect the plotted points thereby transforming the measured data into a representation of the corresponding waveform shape. It being further understood that such technique may be carried out by processor 31. The thresholds of the comparators 25 can be changed under processor control.

Having described the measurement technique in general some consideration will now be given to the way in which the measurements can be processed by the processor 31. As has been explained, the time between the start and stop positions is measured using a 17.5 MHz clock. The clock is asynchronous relative to the start and stop positions and hence the results at each threshold will be either n or n+1 clock cycles (assuming there is no noise on the circuit). In a typical measurement process fifty measurements of a time interval will be made. These will be divided between k occurrences of n clock cycles and (50–k) occurrences of n+1 clock cycles. These results can then be used to construct the pulse shape.

In the total absence of noise the actual pulse position at each threshold can be calculated as $[(k \times n)+(50-k) \times (n+1)]/50$. This would give the average position of the pulse between n and n+1 clock cycles. However when there is noise present the result of the time measurement of the top and bottom of the pulse may vary over several clock cycles, i.e. n, n+1, n+2, n+3, etc. Because the noise affects the signal voltage and not the time, the measurement can be improved by averaging the voltage rather than the time. Thus, an alternative to the processing described above is as follows. At each clock cycle count, the threshold voltages are averaged to produce the pulse shape. The following is an example.

| threshold | no. of counts | |
|---|---|---|
| 10 | 0 | 50 |
| 8 | 5 | 45 |
| 6 | 10 | 40 |
| 4 | 15 | 35 |
| 2 | 20 | 30 |
| 0 | 25 | 25 |
| | 3 | 4 |
| | clock cycles | |

$$\text{Average voltage at time } 3 = (8*5 + 6*10 + 4*15 + 2*20*0*25)/(5 + 10 + 15 + 20 + 25)$$
$$= 2.666$$

Thus it will be seen from the above example that the average voltage at time 3 is 2.666. This can be repeated for each time to allow the waveform shape to be built-up.

Once the waveform shape has been reproduced it can be compared with a standard mask to see whether it is within the required specification. It should be understood that such comparison does not require that the waveform actually be reproduced, e.g., by plotting the measured data. For instance, the average voltages at each measured time may be compared to corresponding data of a mask waveform to determine whether the measured waveform satisfies the waveform's required specification at the measured points. Referring to the above numerical example in which the average voltage at time 3 was found to be 2.666, suppose the average voltage at time 3 is specified as a range between 2.500 V and 3.000 V. Since 2.666 V is between the range 2.500 V and 3.000 V, the measured waveform at time 3 would be considered to be within the specifications. A similar comparison could be made at each measured time.

If there is any intersymbol interference present on the input signal, it will be necessary to select an isolated pulse from the input data stream. A particular application of the present technique is for DS1 pulse measurement. This is a North American standard system operating at 1.544 Mbits per sec. The choice of isolation criterion will depend on expected pulse shape. For DS1 pulses, a sufficient criterion is to have at least one zero preceding the pulse and at least four zeros following it. If this is not available, the criterion is reduced to one zero on either side of the pulse to be measured. If this is not possible, the measurement proceeds using any available pulses. For other transmission systems or at other data rates, a different isolation criterion may be necessary. The pattern detector shown in FIG. 3 is used to detect isolated marks and gate these to the measurement circuitry.

When using a line input signal, the amount of intersymbol interference present is likely to be much greater, leading to the requirement to have a higher number of zeroes surrounding a mark. To perform measurements on the line input signal in these circumstances it will be necessary to transmit a fixed word pattern which contains the appropriate number of zeroes.

Although a particular embodiment of the invention has been described and various modifications suggested, it will be appreciated that other embodiments and modifications will occur to those of ordinary skill in the art which will fall within the true spirit and scope of the invention as set forth in the claims.

I claim:

1. A method of measuring the characteristics of an a.c. waveform comprising the following steps:

measuring the time interval between a first instant when the waveform level attains a first predetermined reference level and a second instant when the waveform level attains a second predetermined level;

repeating the measurements for a plurality of said second predetermined levels; and reconstructing the waveform from said measured time intervals based on the time of the second instant and said second predetermined level.

2. The method according to claim 1, further comprising the step of obtaining several samples of each measurement and determining an average.

3. The method according to claim 1, wherein the time intervals are measurable by starting a counter at the instant the reference level is attained and stopping said counter based on when the other level is attained.

4. The method according to claim 2, wherein the time intervals are measurable by starting a counter at the first instant when the first predetermined reference level is attained and stopping said counter based on when the second predetermined level is attained.

5. Apparatus for use in measuring the characteristics of a waveform comprising:

sensing means for sensing when a waveform attains a predetermined first level and for sensing when said waveform attains a controllable predetermined second level;

measuring means for measuring the time interval between a first instant when the waveform attains said predetermined first level and a second instant when the waveform attains said controllable second level; and waveform construction means for reconstructing said waveform from the time interval measurements based on the time of the second instant and said controllable second level.

6. Apparatus according to claim 5, wherein the measuring means comprises a counter.

7. Apparatus according to claim 5, wherein the sensing means comprises at least one comparator.

8. Apparatus according to claim 6, wherein the sensing means comprises at least one comparator.

* * * * *